United States Patent
Jung

(10) Patent No.: US 9,064,584 B2
(45) Date of Patent: Jun. 23, 2015

(54) NON-VOLATILE MEMORY DEVICE AND METHOD FOR ERASING THE SAME

(71) Applicant: SK hynix Inc., Gyeonggi-do (KR)

(72) Inventor: Sung Wook Jung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/243,617

(22) Filed: Apr. 2, 2014

(65) Prior Publication Data

US 2015/0146487 A1    May 28, 2015

(30) Foreign Application Priority Data

Nov. 22, 2013 (KR) .......................... 10-2013-0143164

(51) Int. Cl.

| G11C 16/14 | (2006.01) |
|---|---|
| G11C 16/16 | (2006.01) |
| G11C 16/04 | (2006.01) |
| G11C 5/02 | (2006.01) |
| G11C 11/56 | (2006.01) |
| G11C 5/06 | (2006.01) |

(52) U.S. Cl.
CPC ............. *G11C 16/14* (2013.01); *G11C 11/5635* (2013.01); *G11C 16/0483* (2013.01); *G11C 5/02* (2013.01); *G11C 5/06* (2013.01); *G11C 2213/71* (2013.01)

(58) Field of Classification Search
CPC ............... G11C 16/17; G11C 16/0483; G11C 11/5635; G11C 2213/71; G11C 5/06; G11C 16/14; G11C 5/02
USPC ............... 365/185.05, 185.17, 185.29, 51, 63
See application file for complete search history.

(56) References Cited

U.S. PATENT DOCUMENTS

| 5,917,757 A * | 6/1999 | Lee et al. ................... 365/185.33 |
| 2014/0063966 A1 * | 3/2014 | Kim .......................... 365/185.18 |

FOREIGN PATENT DOCUMENTS

| KR | 1020060129806 | 12/2006 |
| KR | 1020110119328 | 11/2011 |

* cited by examiner

*Primary Examiner* — Ly D Pham
(74) *Attorney, Agent, or Firm* — IP & T Group LLP

(57) ABSTRACT

Provided are a non-volatile memory device and a method for erasing the non-volatile memory device having vertical channel layers formed with different widths varying by height and a plurality of memory cells stacked along the vertical channel layers, the method including increasing potentials of the vertical channel layers, and when potentials of word lines connected to the memory cells are increased, erasing the memory cells while lowering the potentials of the word lines beginning from a word line positioned in an area in which a width of the vertical channel layer is wide to a word line positioned in an area in which the width of the vertical channel layer is narrow.

17 Claims, 8 Drawing Sheets

NON-VOLATILE MEMORY DEVICE AND METHOD FOR ERASING THE SAME

CROSS-REFERENCE TO RELATED APPLICATION

The present application claims priority to Korean patent application number 10-2013-0143164, filed on Nov. 22, 2013 the entire disclosure of which is incorporated herein by reference in its entirety.

BACKGROUND

1. Field of Invention

Various embodiments of the present invention relate to a non-volatile memory device and a method for erasing the same, and more specifically, to a non-volatile memory device including a vertical channel and a method for erasing the same.

2. Discussion of Related Art

Non-volatile memory devices are used as data storage devices in various electronic devices, such as computers, laptops, and mobile phones. These electronic devices are gradually becoming light-weight. As demand for mass-storage devices increases, NAND flash memory devices are primarily used in the devices.

Conventional NAND flash memory devices include a plurality of memory cells arranged in a direction parallel to a semiconductor substrate, this is known as a two-dimensional semiconductor memory device. However, since a semiconductor memory device with a two-dimensional structure has a limit for increasing integration, semiconductor memory device is being developed that includes a plurality of memory cells vertically stacked on the semiconductor substrate. These are known as a 3D semiconductor memory device or a semiconductor memory device that includes a vertical channel layer, hereinafter, referred to as a three-dimensional semiconductor memory device.

In terms of enhanced integration, the three-dimensional semiconductor memory device is superior to the two-dimensional semiconductor memory device.

Particularly, the three-dimensional semiconductor memory device includes a plurality of memory cells vertically stacked on the semiconductor substrate, and a channel that includes a vertical channel layer extending in a vertical direction with respect to the semiconductor substrate. To form the vertical channel layer, a hole is formed. However, due to the nature of an etching process for forming the hole, a width of the hole is narrower toward a lower portion than an upper portion. During an erase operation using a gate induced drain leakage ("GIDL") current, such a structure may cause an electrical difference between memory cells formed at the upper portion and the memory cells formed at the lower portion.

SUMMARY

Various embodiment of the present invention are directed to a non-volatile memory device and a method for erasing the same, which may improve reliability of an erase operation of a three-dimensional semiconductor memory device.

One embodiment of the present invention provides a method of erasing a non-volatile memory device having vertical channel layers formed with different widths according to height and a plurality of memory cells stacked along the vertical channel layers, the method including increasing potentials of the vertical channel layers, and when potentials of word lines connected to the memory cells are increased, erasing the memory cells while lowering the potentials of the word lines beginning from a word line positioned in an area in which a width of the vertical channel layer is wide, to a word line positioned in an area in which the width of the vertical channel layer is narrow.

Another embodiment of the present invention provides a method for erasing a non-volatile memory device having vertical channel layers formed with a greater upper width than a lower width, on a semiconductor substrate and a pipe gate connecting lower ends of the vertical channel layers to each other, a source line and a bit line connected to an upper end of each of the vertical channel layers, a plurality of memory cells stacked to be spaced apart from each other along the vertical channel layers, and word lines connected to each of the memory cells, the method including applying a preliminary erase voltage to the source line, applying an erase voltage higher than the preliminary erase voltage to the source line, erasing the memory cells while discharging the word lines beginning from the word lines positioned at an upper portion to the word lines positioned at a lower portion, and discharging the source line.

Yet another embodiment of the present invention provides a non-volatile memory device including a memory cell array having a plurality of memory blocks including vertical channel layers having a greater upper width than a lower width formed on a semiconductor substrate, a pipe gate connecting lower ends of the vertical channel layers to each other, a source line and a bit line connected to an upper end of each of the vertical channel layers, a plurality of memory cells stacked to be spaced apart from each other along the vertical channel layers, and word lines connected to each of the memory cells, peripheral circuits that perform an erase operation of a memory block selected from the memory blocks, and a control circuit that controls the peripheral circuits to erase the memory cells while sequentially lowering potentials from the word lines positioned at an upper portion of the vertical channel layers during the erase operation.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DESCRIPTION OF EMBODIMENTS

Figure 1:
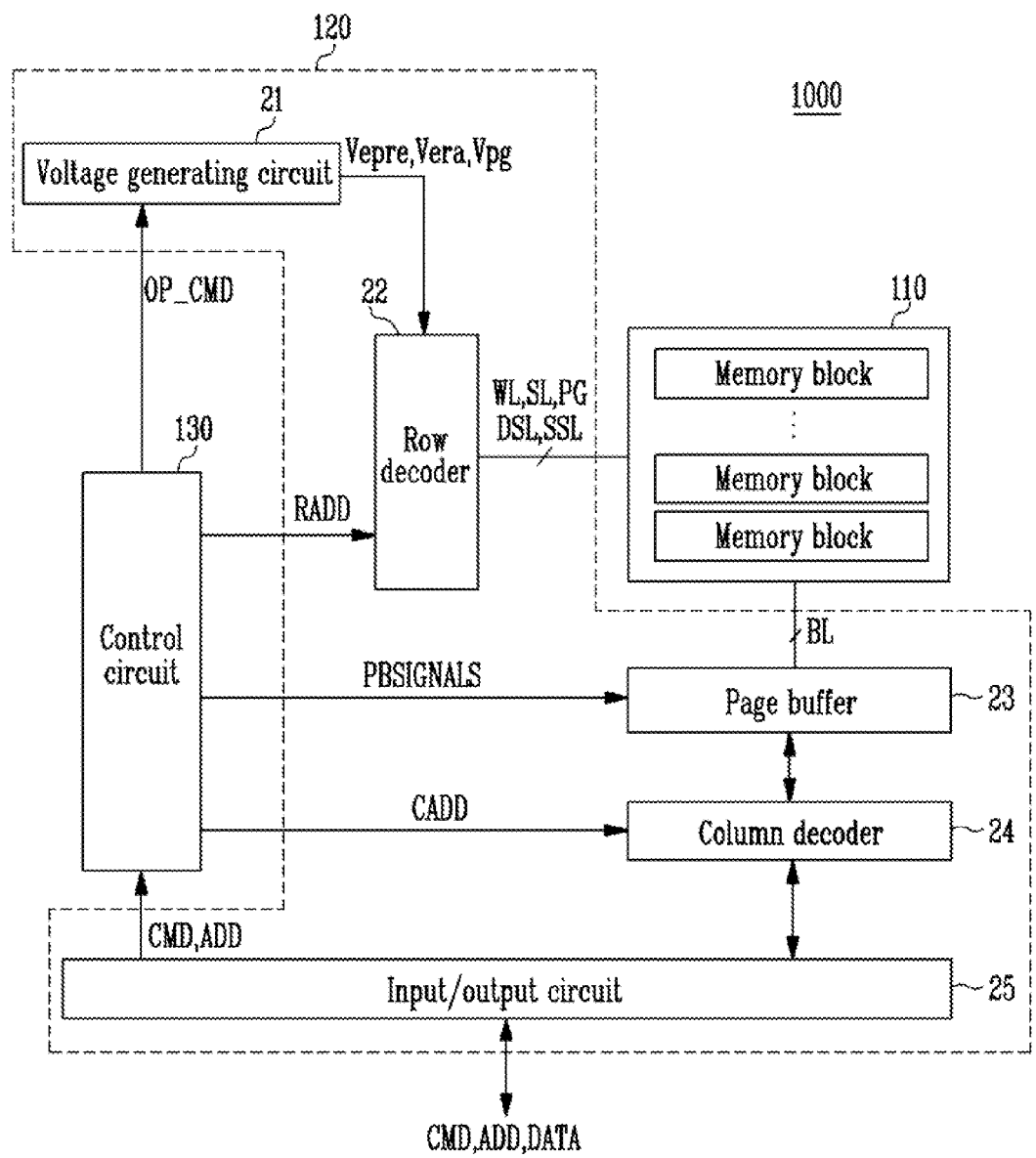
FIG. 1 is a block diagram illustrating a semiconductor memory device according to the present invention.

The present invention will be described more fully hereinafter with reference to the accompanying drawings, in which exemplary embodiments of the invention are shown. This invention may, however, be embodied in different forms and should not be construed as limited to the embodiments set forth herein. It will be apparent to those skilled in the art that various modifications can be made to the embodiments of the present invention without departing from the spirit or scope of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a block diagram illustrating a semiconductor memory device according to the present invention.

Referring to FIG. 1, a semiconductor memory device 1000 includes a memory cell array 110 that stores data, peripheral circuits 120 that may perform a program, read, or erase operation on the memory cell array 110, and a control circuit 130 that controls the peripheral circuits 120.

The memory cell array 110 includes a plurality of memory blocks. Each of the memory blocks includes a plurality of strings arranged in a three-dimensional structure. Details of the memory blocks will be described with reference to FIG. 2.

The peripheral circuits 120 include a voltage generating circuit 21, a row decoder 22, a page buffer 23, a column decoder 24, and an input/output circuit 25.

The voltage generating circuit 21 generates various levels of operation voltages in response to an operation command signal OP_CMD. For example, when the operation command signal OP_CMD related to an erase operation is applied, the voltage generating circuit 21 may generate operation voltages including a preliminary erase voltage Vepre, an erase voltage Vera, and a pipe gate voltage Vpg.

The row decoder 22 selects one of the memory blocks included in the memory cell array 110 in response to a row address RADD, and transmits the received operation voltages to word lines WL, source lines SL, a pipe gate PG, drain select lines DSL, and source select lines SSL, which are connected to the selected memory block.

The page buffer 23 is connected to the memory blocks through bit lines BL, and temporarily stores data needed for each operation during program, read, and erase operations.

The column decoder 24 sends and receives data to and from the page buffer 23 in response to a column address CADD.

The input/output circuit 25 transmits a command signal' CMD and an address signal ADD received from the outside to the control circuit 130, transmits data DATA received from the outside to the column decoder 24, and outputs the data DATA received from the column decoder 24 to the outside.

The control circuit 130 controls the peripheral circuits 120 in response to the command signal CMD and the address signal ADD. Particularly, when the erase operation is performed, the control circuit 130 controls the peripheral circuits 120 such that potentials are lowered beginning from the word lines positioned at an upper portion to the word lines positioned at a lower portion, that are connected along the strings.

Figure 2:
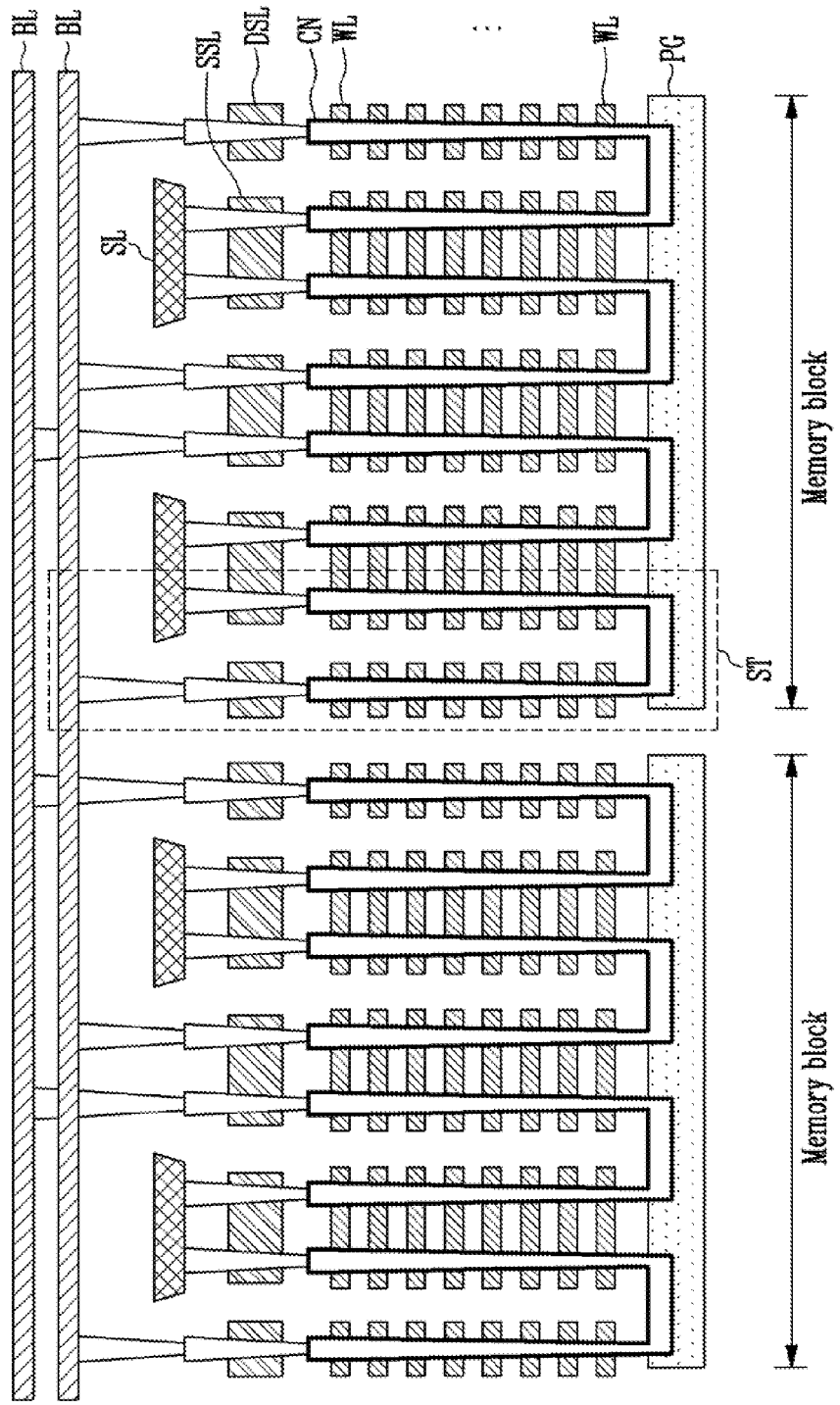
FIG. 2 is a cross-sectional view illustrating a memory block of FIG. 1.

FIG. 2 is a cross-sectional diagram specifically illustrating the memory block of FIG. 1.

Referring to FIG. 2, the plurality of memory blocks may have the same structure as each other. A cross-section of the memory blocks will now be described.

The memory block includes a plurality of strings ST vertically formed on a semiconductor substrate. The strings ST adjacent to each other are formed in a symmetric structure. One out of the plurality of strings ST may be described as follows.

A string ST may include a pipe gate PG formed on the substrate, vertical channel layers CN that vertically extend on the pipe gate PG, and a plurality of word lines WL, a drain select line DSL, and a source select line SSL which are stacked along the vertical channel layers CN spaced apart from each other. The pipe gate PG connects the vertical channel layers CN to each other. Each of the memory cells is formed between the vertical channel layers CN and the word lines WL. A drain select transistor is formed between a plug extending to an upper portion of one end of the vertical channel layers CN and the drain select line DSL. A source select transistor is formed between a plug connected to an upper portion of the other end of the vertical channel layers CN and the source select line SSL. The source line SL is connected to the plug in which the source select transistor is formed, while a bit line BL is connected to the plug in which the drain select transistor is formed.

Due to the nature of a manufacturing process, upper widths of the vertical channel layers CN are greater than lower widths, which causes a difference in area size according to height. Such a structural characteristic may affect an erase operation in a three-dimensional semiconductor memory device.

Specifically, the erase operation in the three-dimensional semiconductor memory device is performed using a gate induced drain leakage ("GIDL") current. The larger the size of the vertical channel layer, the slower the GIDL current is generated, so that the memory cells formed in the upper portion may be erased slower than the memory cells formed in the lower portion of the string ST.

According to an embodiment of the present invention, when the erase operation is performed in the three-dimensional semiconductor memory device, the erase operation may be performed in a uniform manner regardless of the positions of the memory cells by adjusting voltages of the word lines WL differently from each other.

Figure 3:
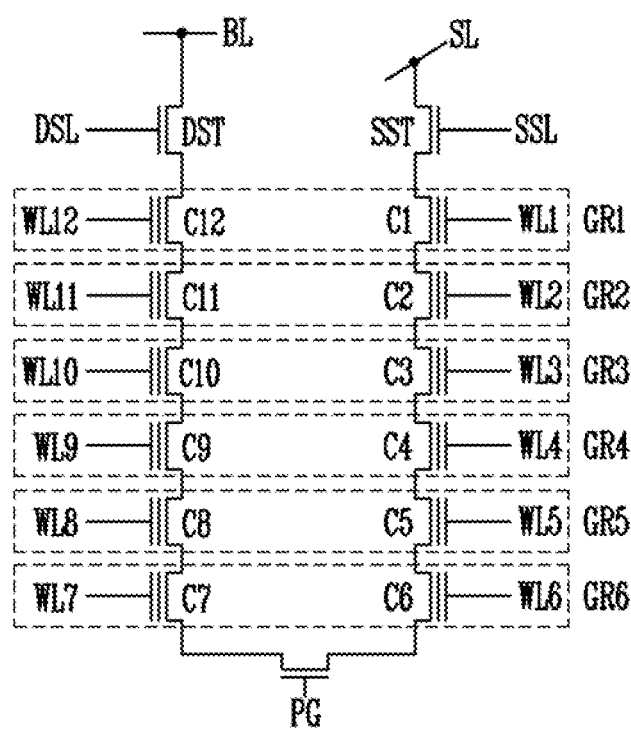
FIG. 3 is a circuit diagram of a string illustrating an erase operation according to a first embodiment of the present invention.

FIG. 3 is a circuit diagram of a string illustrating an erase operation according to a first embodiment of the present invention.

Referring to FIG. 3, a string ST is U-shaped, having an end of one side upper portion of the string ST connected to a source line SL, an end of the other side upper portion connected to a bit line BL, and a pipe gate PG connected to a lower portion of the string ST. First to sixth memory cells C1 to C6 and a source select transistor SST may be connected between the pipe gate PG and the source line SL, and seventh to twelfth memory cells C7 to C12 and a drain select transistor DST may be connected between the pipe gate PG and the bit line BL.

The first to sixth memory cells C1 to C6 are connected in series to each other in a vertical direction, and the first memory cell C1 is disposed adjacent to a lower portion of the source select transistor SST. The seventh to twelfth memory cells C7 to C12 are connected in series to each other in the vertical direction, and the twelfth memory cell 12 is disposed adjacent to a lower portion of the drain select transistor DST. Gates of the first to twelfth memory cells C1 to C12 are connected to first to twelfth word lines WL1 to WL12, respectively.

In the first embodiment, word lines, which are disposed on an area in which electrical characteristics are similar to each other, are grouped and the erase operation is performed. The electrical characteristics may vary depending on the area size of the vertical channel layer (see CN of FIG. 2), and the area size of the vertical channel layer may vary depending on a width. For example, the first and twelfth word lines WL1 and WL12, the second and eleventh word lines WL2 and WL11, the third and tenth word lines WL3 and WL10, the fourth and ninth word lines WL4 and WL9, the fifth and eighth word lines WL5 and WL8, and the sixth and seventh word lines WL6 and WL7 may be grouped, and each group may be controlled in a different manner, which will be described now.

If the word lines are grouped, the first and twelfth word lines WL1 and WL12 may be defined as a first word line group GR1 the second and eleventh word lines WL2 and WL11 may be defined as a second word line group GR2, the third and tenth word lines WL3 and WL10 may be defined as a third word line group GR3, the fourth and ninth word lines WL4 and WL9 may be defined as a fourth word line group GR4, the fifth and eighth word lines WL5 and WL8 may be defined as a fifth word line group GR5, and the sixth and seventh word lines WL6 and WL7 may be defined as a sixth word line group GR6. Herein, the first word line group GR1 is positioned at the uppermost portion out of the first to sixth word line groups GR1 to GR6, the second word line group GR2 is positioned at a lower portion of the first word line group GR1, the third word line group GR3 is positioned at a lower portion of the second word line group GR2, the fourth word line group GR4 is positioned at a lower portion of the third word line group GR3, the fifth word line group GR5 is positioned at a lower portion of the fourth word line group GR4, and the sixth word line group GR6 is positioned at a lower portion of the fifth word line group GR5.

The erase operation of the semiconductor memory device according to the first embodiment will be described with reference to the configurations described above.

Figure 4:
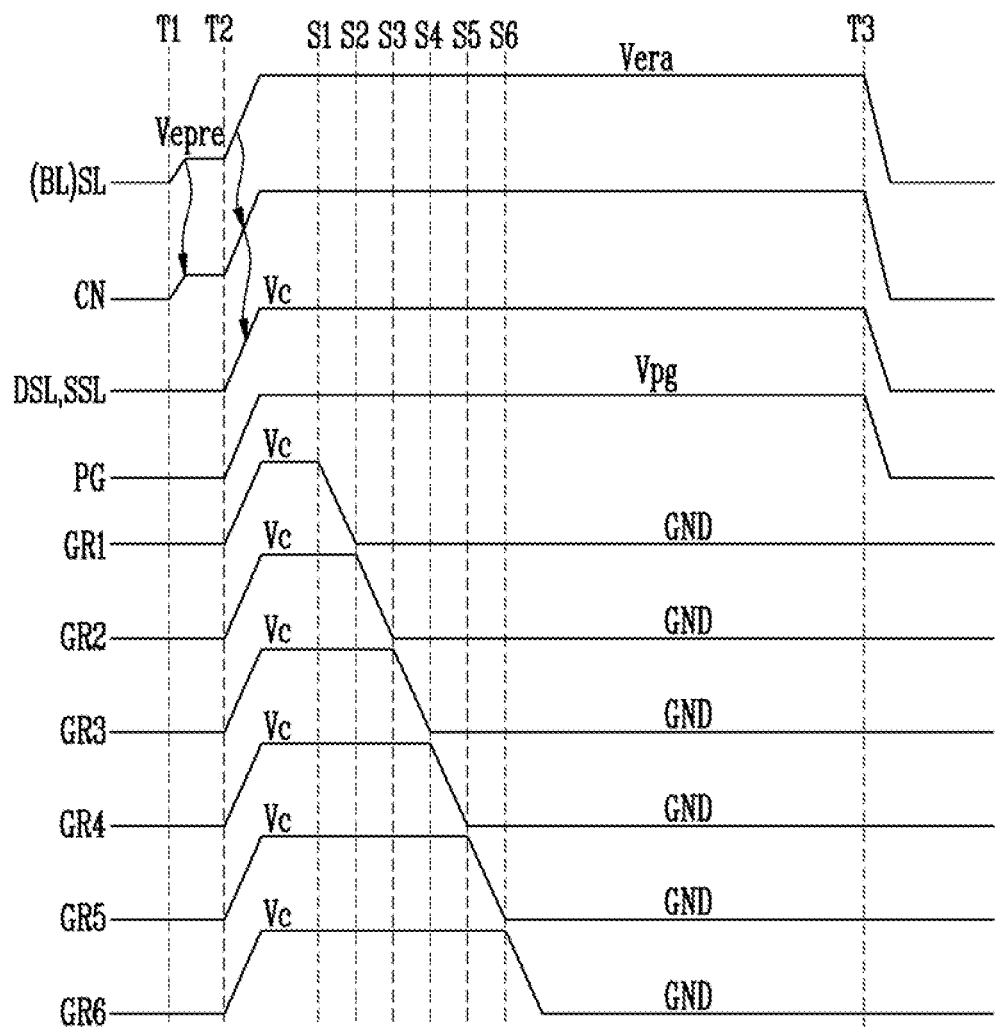
FIG. 4 is a timing diagram illustrating the erase operation according to the first embodiment of the present invention.

FIG. 4 is a timing diagram illustrating the erase operation according to the first embodiment of the present invention.

Referring to FIGS. 3 and 4, the erase operation is performed by increasing potentials of the vertical channel layers (see CN of FIG. 2). That is, potentials of the word lines included in the first to sixth word line groups GR1 to GR6 are increased due to a coupling phenomenon. Depending on positions, the erase operation may be performed in a uniform manner when the potentials of the word lines are lowered beginning from the first word line group GR1 to the sixth word line group GR6.

The erase operation is described as follows.

When the erase operation is started, all of the bit line BL, the drain select line DSL, the source select line SSL, the word lines included in the first to sixth word line groups GR1 to GR6, and the pipe gate PG may be floated until a preliminary erase voltage is applied, that is, before T1.

When a preliminary erase voltage application section begins at time T1, a preliminary erase voltage Vepre is applied to the source line SL. When the preliminary erase voltage Vepre is applied to the source line SL, a potential of the bit line BL may also increase as much as the preliminary erase voltage Vepre, due to a coupling effect between the source line SL and bit line BL. Accordingly, if voltages of the source line SL and the bit line BL, which are connected to both ends of the upper portion of the string ST are increased, a GIDL current is generated at the drain select transistor DST and the source select transistor SST, due to voltage differences from the vertical channel layers CN, thereby causing the potentials of the vertical channel layers CN to rise.

When the potentials of the vertical channel layers CN are increased at time T2, an erase voltage Vera higher than the preliminary erase voltage Vepre is applied. At the same time, to uniformly maintain the potentials of the vertical channel layers CN, a positive pipe gate voltage Vpg is applied to the pipe gate PG. Additionally, at this time, due to the coupling effect with the source line SL, the potential of the bit line BL is increased. Furthermore, when the erase voltage Vera, which is higher than the preliminary erase voltage Vepre, is applied, potentials of the drain select line DSL and the source select line SSL are increased due to the coupling effect between the source line SL and the bit line BL (Vc). Subsequently, potentials of the first to sixth word line groups GR1 to GR6 are also increased (Vc). The potentials of the vertical channel layers CN have been increased to the positive voltage, and thus if the potentials of the first to sixth word line groups GR1 to GR6 maintain the positive voltage, the erase operation may not be performed. Accordingly, the potentials of the word lines, which are included in the first to sixth word line groups GR1 to GR6, need to be lowered sequentially from the word lines positioned at the upper portion in consideration of differences of the widths of the vertical channel layers CN. For example, after the potentials of the vertical channel layers CN are increased, potentials of the word lines of the first word line group G1 are lowered to a ground voltage GND at time S1. Thereby, the erase operation may be performed in the memory cells included in the first word line group GR1. If the potentials of the word lines of the first word line group GR1 are lowered to the ground voltage GND, potentials of the word lines of the second word line group GR2 are lowered to the ground voltage GND at time S2. Thereby, the erase operation may be performed in the memory cells included in the second word line group GR2. In this manner, the potentials of the word lines of the first to sixth word line groups GR1 to GR6 are lowered sequentially to the ground voltage GND.

Therefore, if the time is adjusted in which the potentials of the word lines of the first to sixth word line groups GR1 to GR6 are lowered, the erasing of the data stored in the memory cells, which are included in the first word line group GR1, takes the longest time, while the erasing of the data stored in the memory cells, which are included in the sixth word line group GR6, takes the shortest time, so that the memory cells connected to the vertical channel layers CN having different widths from each other in the upper and lower portions may be uniformly erased.

When an erase operation completion section begins, since the word lines of the first to sixth word line groups GR1 to GR6 have already been discharged at the erase voltage application section T2-T3, the remaining lines such as the source line SL, the bit line BL, the drain select line DSL, and the source select line SSL, are discharged.

Figure 5:
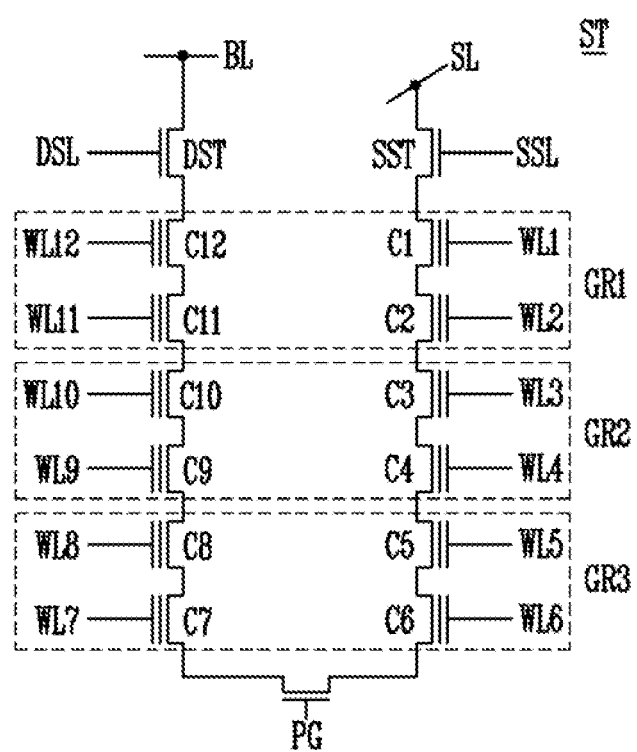
FIG. 5 is a circuit diagram of a string illustrating an erase operation according to a second embodiment of the present invention.

FIG. 5 is a circuit diagram of a string illustrating an erase operation according to a second embodiment of the present invention.

Referring to FIG. 5, a string ST is U-shaped having an end of one side upper portion of the string ST connected to a source line SL, an end of the other side upper portion connected to a bit line BL, and a pipe gate PG connected to a lower portion of the string ST. First to sixth memory cells C1 to C6 and a source select transistor SST may be connected between the pipe gate PG and the source line SL, and seventh and twelfth memory cells C7 to C12 and a drain select transistor DST may be connected between the pipe gate PG and the bit line BL.

The first to sixth memory cells C1 to C6 are connected in series to each other in a vertical direction, and the first memory cell C1 is disposed adjacent to a lower portion of the source select transistor SST. The seventh to twelfth memory cells C7 to C12 are connected in series to each other in the vertical direction, and the twelfth memory cell C12 is disposed adjacent to a lower portion of the drain select transistor DST. Gates of the first to twelfth memory cells C1 to C12 are connected to first to twelfth word lines WL1 to WL12, respectively. Accordingly the first and twelfth word lines WL1 and WL12, the second and eleventh word lines WL2 and WL11, the third and tenth word lines WL3 and WL10, the fourth and ninth word lines WL4 and WL9, the fifth and eighth word lines WL5 and WL8, and the sixth and seventh word lines WL6 and WL7 form pairs with each other, respectively.

If two pairs of word lines adjacent to each other are grouped, the first, twelfth, second, and eleventh word lines (WL1, WL12, WL2, and WL11) may be defined as a first word line group GR1, the third, tenth, fourth, and ninth word lines (WL3, WL10, WL4, and WL9) may be defined as a second word line group GR2, and the fifth, eighth, sixth, and seventh word lines (WL5, WL8, WL6, and WL7) may be defined as a third word line group GR3. Accordingly, the first word line group GR1 is positioned at the uppermost portion out of the first to third word line groups (GR1 to GR3), the second word line group GR2 is positioned at a lower portion of the first word line group GR1, and the third word line group GR3 is positioned at a lower portion of the second word line group GR2.

The erase operation of the semiconductor memory device according to the second embodiment will be described with reference to the configurations described above.

Figure 6:
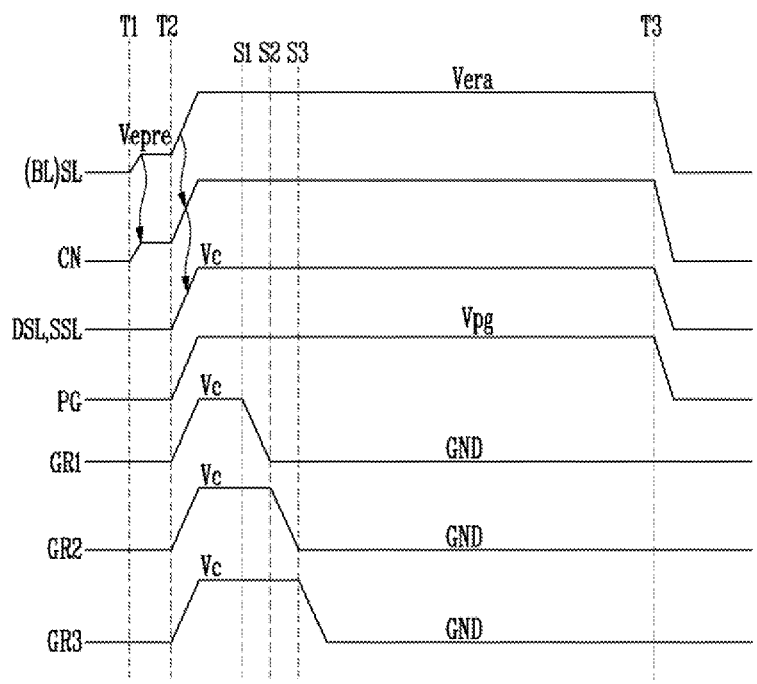
FIG. 6 is a timing diagram illustrating the erase operation according to the second embodiment of the present invention.

FIG. 6 is a timing diagram illustrating the erase operation according to the second embodiment of the present invention.

Referring to FIGS. 5 and 6, the erase operation is performed by increasing potentials of the vertical channel layers (CN of FIG. 2). In this case, potentials of the word lines included in the first to third word line groups GR1 to GR3 are increased due to a coupling phenomenon. The erase operation depending on positions may be uniformly performed when the potentials of the word lines are lowered in order of the first word line group GR1, the second word line group GR2, and the third word line group GR3.

The erase operation is more specifically described as follows.

When the erase operation is started, all of the bit line BL, the drain select line DSL, the source select line SSL, the word lines included in the first to third word line groups GR1 to GR3, and the pipe gate PG may be floated until a preliminary erase voltage is applied, that is, before T1.

When a preliminary erase voltage application section begins at time T1, a preliminary erase voltage Vepre is applied to the source line SL. When the preliminary erase voltage Vepre is applied to the source line SL, a potential of the bit line BL may also increase as much as the preliminary erase voltage Vepre due to a coupling effect between the source line SL and the bit line BL. Accordingly, if voltages of the source line SL and the bit line BL, which are connected to both ends of the upper portion of the string ST, are increased, a GIDL current is generated at both of the drain select transistor DST and the source select transistor SST due to voltage differences from the vertical channel layers CN, thereby causing the potentials of the vertical channel layers CN to rise.

When the potentials of the vertical channel layers CN are increased at time T2, an erase voltage Vera higher than the preliminary erase voltage Vepre is applied to the source line SL. At the same time, to uniformly maintain the potentials of the vertical channel layers CN, a positive pipe gate voltage Vpg is applied to the pipe gate PG. Additionally, at this time, due to the coupling effect with the source line SL, the potential of the bit line BL is increased. Furthermore, when the erase voltage Vera is applied, which is higher than the preliminary erase voltage Vepre, potentials of the drain select line DSL and the source select line SSL are increased due to the coupling effect with the source line SL and the bit line BL (Vc). Subsequently, potentials of the first to third word line groups GR1 to GR3 are also increased (Vc). The potentials of the vertical channel layers CN have been increased to the positive voltage, and thus if the potentials of the first to third word line groups GR1 to GR3 maintain the positive voltage, the erase operation is not performed. Accordingly, the potentials of the word lines, which are included in the first to third word line groups GR1 to GR3, need to be lowered sequentially from the word lines positioned at the upper portion in consideration of differences of the widths of the vertical channel layers CN. For example, after the potentials of the vertical channel layers CN are increased, potentials of the word lines of the first word line group G1 are lowered to a ground voltage GND at time S1. Thereby, the erase operation is performed in the memory cells included in the first word line group GR1. If potentials of the word lines of the first word line group GR1 are lowered to the ground voltage GND, potentials of the word lines of the second word line group GR2 are lowered to the ground voltage GND at time S2. Thereby, the erase operation is performed in the memory cells included in the second word line group GR2. Subsequently, if potentials of the word lines of the second word line group GR2 are lowered to the ground voltage GND potentials of the word lines of the third word line group GR3 are lowered to the ground voltage GND at time S3. Thereby, the erasing operation is performed in the memory cells included in the third word line group GR3.

As such, if the time is adjusted in which the potentials of the word lines of the first to third word line groups GR1 to GR3 are lowered, the erase operation in the memory cells, which are included in the first word line group GR1, takes the longest time, which is a first time, the erase operation in the second word line group GR2 takes a second time, which is less than the first time, and the erase operation in the third word line group GR3 takes the shortest time, which is a third time, so that the memory cells, which are connected to the vertical channel layers CN having different width from each other between the upper and lower portions may be uniformly erased.

When an erase operation completion section begins, since the word lines of the first to third word line groups GR1 to GR3 have already been discharged at the erase voltage completion section T2-T3, the remaining lines such as the source line SL, the bit line BL, the drain select line DSL, and the source select line SSL are discharged.

In the second embodiment described above, four word lines adjacent to each other in a vertical direction are grouped. However, the number of word lines included in one word line group may be set in a different manner in accordance with semiconductor devices.

Figure 7:
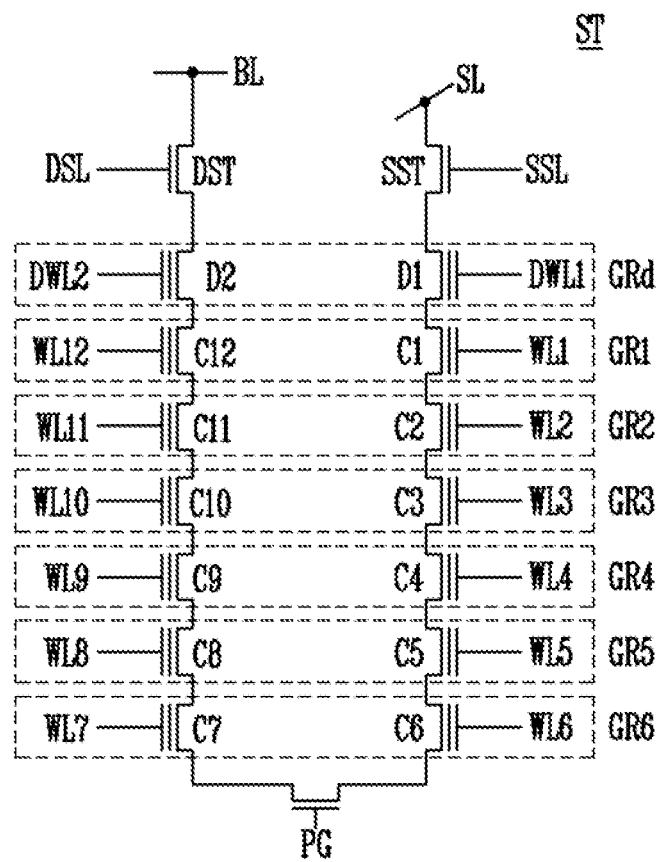
FIG. 7 is a circuit diagram of a string illustrating an erase operation according to a third embodiment of the present invention.

FIG. 7 is a circuit diagram of a string illustrating an erase operation according to a third embodiment of the present invention.

Referring to FIG. 7, a string ST may include dummy cells D1 and D2 connected to dummy word lines DWL1 and DWL2. The dummy cells D1 and D2 may be included to suppress interference between memory cells, or to improve an electrical characteristic between word lines WL1 to WL12. In FIG. 7, it is illustrated that the first dummy cell D1 is connected between a first memory cell C1 and a source select transistor SST, and the second dummy cell D2 is connected to a twelfth memory cell C12 and a drain select transistor DST. However, the dummy cells may be formed between the memory cells C1 to C12, and be connected between the sixth and seventh memory cells C6 and C7 and a pipe gate PG.

The string ST including the dummy cells D1 and D2 is specifically described as follows.

A string ST is U-shaped, having an end of one side upper portion of the string ST connected to a source line SL, an end of the other side upper portion connected to a bit line BL, and the pipe gate PG connected to a lower portion of the string ST. The first to sixth memory cells C1 to C6, the first dummy cell D1, and the source select transistor SST may be connected between the pipe gate PG and the source line SL, and the seventh to twelfth memory cells C7 to C12, the second dummy cell D2, and the drain select transistor DST may be connected between the pipe gate PG and the bit line BL.

The first to sixth memory cells C1 to C6 are connected in series to each other in a vertical direction, and the first dummy cell D1 is connected between the first memory cell C1 and the source select transistor SST. The seventh to twelfth memory cells C7 to C12 are connected in series to each other in the vertical direction, and the second dummy cell D2 is connected between the twelfth memory cell 12 and the drain select transistor DST. A gate of the first dummy cell D1 is connected to the first dummy line DWL1, and a gate of the second dummy cell D2 is connected to the second dummy line DWL2. Gates of the first to twelfth memory cells C1 to C12 are connected to the first to twelfth word lines WL1 to WL12, respectively. Accordingly, the first and second dummy lines DWL1 and DWL2, the first and twelfth word lines WL1 and WL12, the second and eleventh word lines WL2 and WL11, the third and tenth word lines WL3 and WL10, the fourth and ninth word lines WL4 and WL9, the fifth and eighth word lines WL5 and WL8, and the sixth and seventh word lines WL6 and WL7 form pairs with each other, respectively.

If each of the pairs is grouped, the first and second dummy lines D1 and D2 may be defined as a dummy line group GRd, the first and twelfth word lines WL1 and WL12 may be defined as a first word line group GR1, the second and eleventh word lines WL2 and WL11 may be defined as a second word line group GR2 the third and tenth word lines WL3 and WL10 may be defined as a third word line group GR3, the fourth and ninth word lines WL4 and WL9 may be defined as a fourth word line group GR4, the fifth and eighth word lines WL5 and WL8 may be defined as a fifth word line group GR5, and the sixth and seventh word lines WL6 and WL7 may be defined as a sixth word line group GR6. Accordingly, the first word line group GR1 is positioned at the uppermost portion out of the first to sixth word line groups GR1 to GR6, the second word line group GR2 is positioned at a lower portion of the first word line group GR1, the third word line group GR3 is positioned at a lower portion of GR2, the fourth word line group GR4 is positioned at a lower portion of the third word line group GR3, the fifth word line group GR5 is positioned at a lower portion of the fourth word line group GR4, and the sixth word line group GR6 is positioned at a lower portion of the fifth word line group GR5. The dummy line group GRd may be positioned between the first to sixth word line groups GR1 to GR6.

Referring to the configurations described above, an erase operation of the semiconductor memory device according to the third embodiment will be described as follows.

Figure 8:
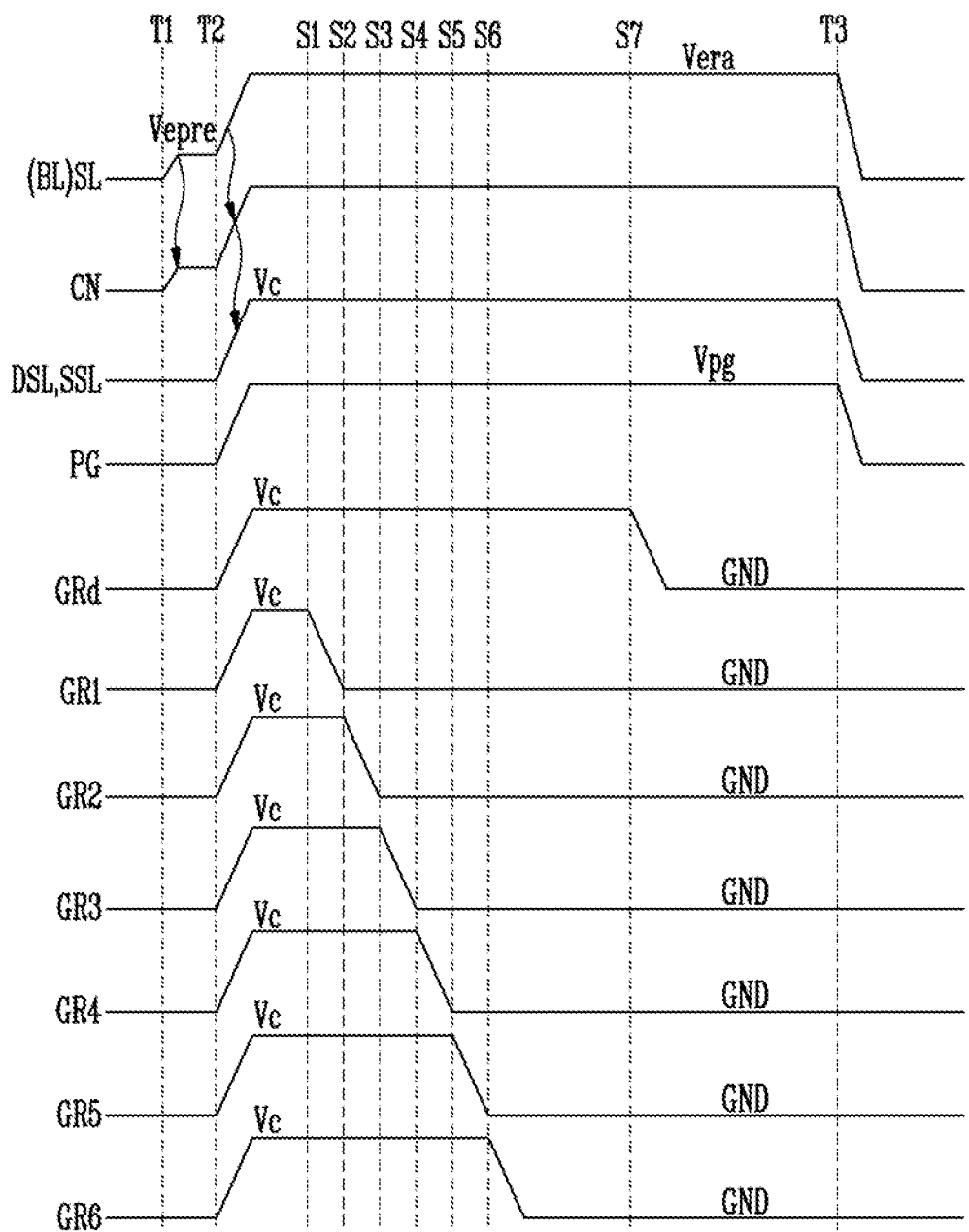
FIG. 8 is a timing diagram illustrating the erase operation according to the third embodiment of the present invention.

FIG. 8 is a timing diagram illustrating the erase operation according to the third embodiment of the present invention.

Referring to FIGS. 7 and 8, the erase operation is performed by increasing potentials of the vertical channel layers (CN of FIG. 2). In this case, potentials of the word lines included in the first to sixth word line groups GR1 to GR6 are increased due to a coupling effect. The erase operation depending on positions may be uniformly performed when the potentials of the word lines are lowered in order from the first word line group GR1 to the sixth word line group GR6.

The erase operation is more specifically described as follows.

When the erase operation is started, all of the bit line BL, the drain select line DSL, the source select line SSL, the dummy line group GRd, the word lines included in the first to sixth word line groups GR1 to GR6, and the pipe gate PG may be floated until a preliminary erase voltage is applied, that is, before T1.

When a preliminary erase voltage application section begins at time T1, a preliminary erase voltage Vepre is applied to the source line SL. When the preliminary erase voltage Vepre is applied to the source line SL, a potential of the bit line BL may also be increased as much as the preliminary erase voltage Vepre due to a coupling effect between the source line SL and the bit line BL. Accordingly, if voltages of the source line SL and the bit line BL, which are connected to both ends of the upper portion of the string ST, are increased a GIDL current is generated at the drain select transistor DST and the source select transistor SST, due to voltage differences from the vertical channel layers CN, thereby causing the potentials of the vertical channel layers CN to rise.

When the potentials of the vertical channel layers CN are increased at time T2, an erase voltage Vera higher than the preliminary erase voltage Vepre is applied to the source line SL. At the same time, to uniformly maintain the potentials of the vertical channel layers CN, a positive pipe gate voltage Vpg is applied to the pipe gate PG. At this time, due to the coupling effect with the source line SL, the potential of the bit line BL is increased. Additionally, when the erase voltage Vera is applied, which is higher than the preliminary erase voltage Vepre, potentials of the drain select line DSL and the source select line SSL are increased due to the coupling effect between the source line SL and the bit line BL (Vc). Subsequently, potentials of the first and second dummy lines DL1 and DL2 included in the dummy line group GRd and potentials of the first to twelfth word lines WL1 to WL12 included in the first to sixth word line groups GR1 to GR6 are also increased (Vc). The potentials of the vertical channel layers CN have been increased to the positive voltage, and thus if the potentials of the first to sixth word line groups GR1 to GR6 maintain the positive voltage, the erase operation may not be performed. Accordingly, the potentials of the word lines, which are included in the first to sixth word line groups GR1 to GR6, need to be lowered sequentially from the word lines positioned at the upper portion in consideration of differences of the widths between the vertical channel layers CN. For example, after the potentials of the vertical channel layers CN are increased, potentials of the word lines of the first word line group G1 are lowered to a ground voltage GND at time S1. Thereby, the erase operation is performed in the memory cells included in the first word line group GR1. If potentials of the word lines of the first word line group GR1 are lowered to the ground voltage GND, potentials of the word lines of the second word line group GR2 are lowered to the ground voltage GND at time S2. Thereby, the erase operation is performed in the memory cells included in the second word line group GR2. In this manner, the potentials of the word lines from the first word line group GR1 to the sixth word line group GR6 are lowered sequentially to the ground voltage GND.

As such, if the time is adjusted in which the potentials of the word lines of the first to sixth word line groups GR1 to GR6 are lowered, the erasing of the memory cells included in the first word line group GR1 takes the longest time, and the erasing of the memory cells included in the sixth word line group GR6 takes the shortest time, so that the memory cells, which are connected to the vertical channel layers CN having different widths from each other between the upper and lower portions, may be uniformly erased.

The potentials of the word lines of the first to sixth word line groups GR1 to GR6 are lowered sequentially to the ground voltage GND, and then at time S7, the potentials of the dummy lines DL1 and DL2 of the dummy line group GRd are lowered to the ground voltage GND. Although not illustrated in drawings, if each of the dummy lines is arranged in upper and lower portions of the string ST, after the potentials of the first word line group GR1 are lowered to the ground voltage GND, the potentials of the upper portion dummy lines are lowered to the ground voltage GND, the potentials of the sixth word line group GR6 are lowered to the ground voltage GND, and then the potentials of the lower portion dummy lines may be lowered to the ground voltage GND.

When an erase operation completion section begins at time T3, since the word lines of the first to sixth word line groups GR1 to GR6 have already been discharged at the erase voltage application section T2-T3 the remaining lines such as the source line SL, the bit line BL, the drain select line DSL, and the source select line SSL are discharged.

As described above, when the erase operation is performed on the three-dimensional semiconductor memory device in which width of the vertical channel layers CN is formed to be narrower toward the lower portion than from the upper portion, if the potentials are lowered to the ground voltage GND beginning from the word lines positioned at the upper portion of the string to the word lines positioned at the lower portion, the memory cells may be uniformly erased regardless of positions.

In addition, the erase operation may be performed on the three-dimensional semiconductor memory device including an I-shaped string in addition to the U-shaped string.

According to the present invention, memory cells may be uniformly erased regardless of positions during an erase operation in a three-dimensional semiconductor memory device, thereby improving reliability of the erase operation in the three-dimensional semiconductor memory device.

In the drawings and specification, there have been disclosed typical exemplary embodiments of the invention, and although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. An erase method for a non-volatile memory device having vertical channel layers formed with different widths varying by height and a plurality of memory cells stacked along the vertical channel layers, the method comprising:
   increasing potentials of the vertical channel layers; and
   erasing, when potentials of word lines connected to the memory cells are increased, the memory cells while sequentially lowering the potentials of the word lines beginning from a word line positioned in an area in which a width of the vertical channel layer is wide to a word line positioned in an area in which the width of the vertical channel layer is narrow.

2. The method of claim 1, wherein the increasing of the potentials of the vertical channel layers includes:
   generating a gate induced drain leakage (GIRL) current in the vertical channel layers by applying a preliminary erase voltage lower than an erase voltage to a source line connected to one end of each of the vertical channel layers; and
   applying the erase voltage to the source line to increase the potentials of the vertical channel layers.

3. The method of claim 1, wherein the word lines are discharged to lower the potentials of the word lines.

4. The method of claim 1, further comprising:
   lowering the potentials of the vertical channel layers after the potentials of all word lines are lowered.

5. The method of claim 4, wherein the lowering of the potentials of the vertical channel layers includes discharging a source line connected to one end of each of the vertical channel layers.

6. The method of claim 1, further comprising:
   grouping at least two word lines adjacent to each other in a vertical direction and defining a plurality of word line groups before lowering the potentials of the word lines.

7. The method of claim 6, wherein, when sequentially lowering the potentials of the word lines, a potential of a word line group positioned in an area in which the width of the vertical channel layer is widest out of the word line groups is lowered, and then a potential of a word line group positioned in an area in which the width of the vertical channel layer is comparatively narrow is lowered.

8. An erase method for a non-volatile memory device having vertical channel layers vertically formed on a semiconductor substrate with a greater upper width than a lower width, a pipe gate connecting lower ends of the vertical channel layers to each other, a source line and a bit line connected to an upper end of each of the vertical channel layers, a plurality of memory cells stacked to be spaced apart from each other along the vertical channel layers, and word lines connected to each of the memory cells, the method comprising:
   applying a preliminary erase voltage to the source line;
   applying an erase voltage higher than the preliminary erase voltage to the source line;
   erasing the memory cells while sequentially discharging the word lines beginning from the word lines positioned at an upper portion to the word lines positioned at a lower portion; and
   discharging the source line.

9. The method of claim 8, wherein the word lines are discharged when potentials of the vertical channel layers are increased by the erase voltage applied to the source line and potentials of the word lines are increased by the potentials of the vertical channel layers and the source line.

10. The method of claim 8, wherein the non-volatile memory device further includes dummy cells stacked along the vertical channel layers.

11. The method of claim 10, further comprising:
   discharging dummy lines connected to the dummy cells positioned at an upper portion, and then discharging dummy lines connected to the dummy cells positioned at a comparatively lower portion.

12. A non-volatile memory device, comprising:

a memory cell array having a plurality of memory blocks including vertical channel layers formed on a semiconductor substrate and having a greater upper width than a lower width, a pipe gate connecting lower ends of the vertical channel layers to each other, a source line and a bit line connected to an upper end of each of the vertical channel layers, a plurality of memory cells stacked to be spaced apart from each other along the vertical channel layers, and word lines connected to each of the memory cells;

peripheral circuits suitable for performing an erase operation of a memory block selected out of the memory blocks; and a control circuit controlling the peripheral circuits to erase the memory cells while sequentially lowering potentials from the word lines positioned at an upper portion of the vertical channel layers during the erase operation.

13. The non-volatile memory device of claim 12, wherein a source select transistor, which operates in response to a voltage applied to a source select line, is connected between the memory cells and the source line, and a drain select transistor, which operates in response to a voltage applied to a drain select line, is connected between the memory cells and the bit line.

14. The non-volatile memory device of claim 12, wherein, when the erase operation is started, the control circuit controls the peripheral circuits such that a preliminary erase voltage is applied to the source line to generate a gate induced drain leakage (GIDL) current in the vertical channel layers, an erase voltage is applied to the source line to increase potentials of the vertical channel layers, and then the word lines are sequentially discharged.

15. The non-volatile memory device of claim 13, wherein the control circuit controls such that the source line is discharged after discharging all of the word lines.

16. The non-volatile memory device of claim 12, further comprising:

dummy cells formed along the vertical channel layers.

17. The non-volatile memory device of claim 16, wherein the control circuit controls the peripheral circuits such that dummy lines connected to the dummy cells positioned at an upper portion are discharged, and then dummy lines connected to the dummy cells positioned at a comparatively lower portion are discharged.

* * * * *